United States Patent
Navarro et al.

(10) Patent No.: US 9,558,861 B2
(45) Date of Patent: Jan. 31, 2017

(54) BLOCK COPOLYMERS THAT DISPERSE NANOFILLERS IN WATER

(71) Applicants: Arkema France, Colombes (FR); Centre National De La Recherche Scientifique, Paris (FR); Universite De Bordeaux, Talence (FR); Institut Polytechnique De Bordeaux, Talence (FR)

(72) Inventors: Christophe Navarro, Bayonne (FR); Katerina Bethani, Bordeaux (FR); Cyril Brochon, Merignac (FR); Henri Cramail, Sainte-Terre (FR); Guillaume Fleury, Bordeaux (FR); Georges Hadziioannou, Leognan (FR); Eric Cloutet, Saint Caprais de Brodeaux (FR)

(73) Assignees: ARKEMA FRANCE, Colombes (FR); CENTRE NATIONAL DE LA RECHERCHE SCIENTIFIQUE, Paris (FR); UNIVERSITE DE BORDEAUX, Talance (FR); INSTITUT POLYTECHNIQUE DE BORDEAUX, Talance (FR)

( * ) Notice: Subject to any disclaimer, the term of this patent is extended or adjusted under 35 U.S.C. 154(b) by 0 days.

(21) Appl. No.: 14/390,696

(22) PCT Filed: Apr. 3, 2013

(86) PCT No.: PCT/FR2013/050734
§ 371 (c)(1),
(2) Date: Oct. 3, 2014

(87) PCT Pub. No.: WO2013/150242
PCT Pub. Date: Oct. 10, 2013

(65) Prior Publication Data
US 2015/0060737 A1    Mar. 5, 2015

(30) Foreign Application Priority Data
Apr. 6, 2012   (FR) .................................. 12 53228

(51) Int. Cl.
*H01B 1/12*        (2006.01)
*H01B 1/14*        (2006.01)
(Continued)

(52) U.S. Cl.
CPC ............. *H01B 1/124* (2013.01); *C08G 61/126* (2013.01); *C08L 65/00* (2013.01); *H01B 1/127* (2013.01);
(Continued)

(58) Field of Classification Search
CPC .. H01B 1/124–1/128; H01B 1/14; H01B 1/16; H01B 1/18; H01B 1/20; H01B 1/24; C08G 61/12–61/128; C08G 2261/126; C08G 2261/18; C08G 2261/20; C08G 2261/322–2261/323; H01L 51/0036; H01L 51/0043; H01L 51/442; H01L 51/444; H01L 31/1884; C08L 65/00; C08L 65/02; C09D 11/52; B01F 3/1235; B01F 3/1242
See application file for complete search history.

(56) References Cited

U.S. PATENT DOCUMENTS 5,408,109 A * 4/1995 Heeger ............... H01L 51/0012
                                                             257/10
6,538,263 B1 * 3/2003 Park ..................... C08L 101/12
                                                             257/40
(Continued)

FOREIGN PATENT DOCUMENTS

CN      103483508 A  *  1/2014
WO      2009086210       7/2009

OTHER PUBLICATIONS

Zou et al., "A general strategy to disperse and functionalize carbon nanotubes using conjugated block copolymers," Advanced Functional Materials, vol. 19, No. 3, Feb. 10, 2009, pp. 479-483, XP001520301.

(Continued)

*Primary Examiner* — Mark Kopec
*Assistant Examiner* — Matthew R Diaz
(74) *Attorney, Agent, or Firm* — RatnerPrestia

(57) ABSTRACT

The invention relates to novel block copolymers that enable a good dispersion of nanofillers in water and also to a dispersion of nanofillers obtained owing to these block copolymers. This dispersion may be used as a transparent electrode in organic solar cells or other photoemitter or photoreceptor devices.

18 Claims, 5 Drawing Sheets

(51) Int. Cl.
*H01L 51/00* (2006.01)
*C08G 61/12* (2006.01)
*C08L 65/00* (2006.01)
*H01L 51/44* (2006.01)

(52) U.S. Cl.
CPC ............ *H01B 1/14* (2013.01); *H01L 51/0036* (2013.01); *H01L 51/0043* (2013.01); *C08G 2261/126* (2013.01); *C08G 2261/18* (2013.01); *C08G 2261/3223* (2013.01); *C08G 2261/91* (2013.01); *H01L 51/444* (2013.01)

(56) References Cited

U.S. PATENT DOCUMENTS

| 7,704,415 | B2* | 4/2010 | Su | H01L 51/0043 136/263 |
| 2008/0248313 | A1* | 10/2008 | Seshadri | C08G 61/126 428/419 |
| 2009/0118420 | A1 | 5/2009 | Zou | |
| 2010/0038597 | A1* | 2/2010 | Reynolds | C09D 5/24 252/500 |
| 2010/0137518 | A1* | 6/2010 | Yang | C08F 293/005 525/186 |
| 2011/0288241 | A1* | 11/2011 | Oh | B82Y 30/00 525/376 |

OTHER PUBLICATIONS

Huang et al., "Synthesis, micellar structures, and multifunctional sensory properties of poly(3-hexylthiophene)-block-poly(2-(dimethylamino)thyl methacrylate) rod-coil diblock copolymers," Journal of Polymer Science Part A: polymer chemistry, vol. 49, No. 1, Jan. 1, 2011, pp. 147-155, XP055047312.
Zhai, "Conjugated Polymer/Carbon Nanotube Composites," PMSE Preprints, vol. 103, Aug. 22, 2010, pp. 605-606, XP009165561.
Mougnier et al., "Facile and versatile synthesis of rod-coil (3-hexylthiophene)-based block copolymers by nitroxide-mediated radical polymerization," Journal of Pol. Science Part A: Polymer chemistry. 2012, 50, pp. 2463-2470.
Sary et al., "A new supramolecular route for using rod-coil block copolymers in photovoltaic applications," Advanced Materials, vol. 22, No. 6, Feb. 9, 2010, pp. 763-768, XP055047208.
Kim et al., "Surface modifications for the effective dispersion of carbon nanotubes in solvents and polymers," Carbon Elsevier, Oxford, GB, vol. 50, No. 1, Aug. 10, 2011, pp. 3-33, XP028307789.
Stokes et al., "Photoresponse in large area multiwalled carbon nanotube/polymer nanocomposite films," Applied Physics Letters, AIP, American Institute of Physics, Melville, NY, US, vol. 94, No. 4, Jan. 30, 2009, XP012118756, pp. 042110-1 to 042110-3.
Sun et al., "PS-b-P3HT Copolymers as P3HT/PCBM Interfacial Compatibilizers for High Efficiency Photovoltaics," Advanced Materials, vol. 23, No. 46, Dec. 8, 2011, pp. 5529-5535, XP055047205.
Minami, T., "Substitution of transparent conducting oxide thin films for indium tin oxide transparent electrode applications," Thin Solid Films, vol. 516, 2008, pp. 1314-1321.
Xue, F. et al, "Modified PEDOT-PSS Conducting Polymer as S/D Electrodes for Device Performance Enhancement of P3HT TFTs," IEEE Transactions on Electron Devices, vol. 52, No. 9, Sep. 9, 2005, pp. 1982-1987.
Zhu, J. et al., "Transparent Conductors from Carbon Nanotubes LBL-Assembled with Polymer Dopant with pi-pi Electron Transfer," Journal of the American Chemical Society vol. 133, 2011, pp. 7450-7460.
Loewe, R. S. et al., Regioregular, Head-to-Tail Coupled Poly(3-alkylthiophenes) Made Easy by the Grim Method: Investigation of the Reaction and the Origin of Regioselectivity, Macromolecules, vol. 34, No. 13, 2001, pp. 4324-4333.
Jeffries-El, M. et al., "In-Situ End-Group Functionalization of Regioregular Poly(3-alkylthiophene) Using the Grignard Metathesis Polymerization Method," Advanced Materials, vol. 16, No. 12, 2004, pp. 1017-1019.
International Search Report for International Application No. PCT/FR2013/050734 mailed Sep. 25, 2013.
International Preliminary Report on Patentability for International Application No. PCT/FR2013/050734 mailed Oct. 7, 2014.

* cited by examiner

| % by weight of carbon nanotubes | % by weight of copolymer of example 1 | Optical microscopy (scale bar:100 μm) |
|---|---|---|
| 0.1 | 0.5 | |
| 0.3 | 0.5 | |
| 0.5 | 0.5 | |

| % by weight of carbon nanotubes | % by weight of copolymer of example 1 | R (Ω/sq) | T (%) | Thickness (nm) |
|---|---|---|---|---|
| 0.1 | 0.5 | 18 10$^3$ | 83 | 25 (±5 nm) |
| 0.5 | 0.5 | 7 10$^3$ | 76 | 35 (±5 nm) |

Cryo-TEM image of the dispersion of SWCNTs with the copolymer in water (scale: 0.5 μm)

BLOCK COPOLYMERS THAT DISPERSE NANOFILLERS IN WATER

CROSS-REFERENCE TO RELATED APPLICATIONS

This application is a U.S. National Phase Patent Application of PCT Application No. PCT/FR2013/050734, filed Apr. 2, 2013, which claims priority to French Patent Application No. 12.53228 filed Apr. 6, 2012; the content of each of the aforementioned applications is incorporated by reference herein in its entirety for all purposes.

FIELD OF THE INVENTION

The invention relates to novel block copolymers that enable a good dispersion of nanofillers in water.

The invention also relates to a dispersion of nanofillers obtained by virtue of the block copolymers of the invention and also to the use of said dispersion as transparent electrodes in organic solar cells or other photoemitter or photoreceptor devices.

DESCRIPTION OF THE RELATED ART

In photovoltaic and photoemitter or photoreceptor systems, it is necessary to use transparent conductive layers. The materials generally used are conductive oxides, such as tin-doped indium oxide. This material has the advantage of being transparent, a good electrical conductor and easy to form and is chemically stable. On the other hand, it is difficult to manufacture and therefore expensive. In addition, the process for manufacturing it generates pollutant products.

New materials, having the advantages of tin-doped indium oxide, without its drawbacks, are therefore sought. Alternatives used to bypass the problems of manufacturing tin-doped indium oxide consist in combining it with other oxides, such as zinc oxide or tin oxide. Other solutions use indium-free materials, such as zinc oxide doped with aluminum or gallium or else fluorine-doped zinc oxide, but these are not good solutions since they have other disadvantages, such as their electrical stability in a moist environment. These disadvantages are described in the article by Tadatsugu, M., Thin Solid Films, (516) 1314, (2008).

Moreover, conductive polymers have been tested as materials of transparent electrodes. Mention may be made of the PEDOT:PSS (poly(3,4-ethylenedioxythiophene): sodium polystyrene sulfonate) formulations as promising, since they combine good conductivity (29.6 S/cm) and good film-forming capacity. On the other hand, their electrical stability is sensitive to high temperatures, to moisture and to ultraviolet radiation, as described by Xue, F et al, Electron Devices, IEEE Transactions on (9) 1982 (2005).

Because of the great need for transparent electrodes to be provided, other materials are being studied in order to replace in particular tin-doped indium oxide, especially in solar cell applications. Mention may be made of conductive films based on silver nanowires, thin metal films, nanotube films or graphene films as potentially promising candidates. Regarding more particularly carbon nanotubes, they can have two types of application in solar cells, firstly as an active layer where they can act as semiconductors, secondly as an electrode.

Carbon nanotubes are the materials that are amongst the most promising. They are considered to be the result of the folding of graphite sheets into carbon cylinders or tubes. They exist in various forms depending on the number of walls: single-walled, double-walled, or multi-walled. Depending on the folding angle and diameter of the tubes, semiconductive or metallic electron states are obtained. Carbon nanotubes are now well known for their extraordinary electrical, mechanical and optical properties. The high conductivity of carbon nanotubes depends on several parameters, including their degree of dispersion.

Several methods are known for obtaining a good dispersion of carbon nanotubes, such as the use of surfactants, or the use of functionalized carbon nanotubes combined with dispersing polymers or other dispersants such as DNA, proteins or starch. These dispersants must subsequently be removed once the film has formed, by means of a specific treatment, since they are electrically insulating. The coating of carbon nanotubes with polymers is a conventional method for ensuring good dispersion thereof. The polymers bond to the surface of the carbon nanotubes via n-n interactions, thereby preserving the intrinsic properties of the carbon nanotubes. They are typically conjugated polymers or polymers containing pyrene entities (Zhu, J. et al. Journal of the American Chemical Society (133)7450, (2011)). Use may be made of both homopolymers and block copolymers. Thus far, there is no solution for suitably dispersing carbon nanotubes in an aqueous medium, and applying this dispersion so as to make a film thereof of good quality which does not require subsequent treatment.

The applicant has now discovered that block copolymers, at least one of the blocks of which is a conjugated conductive polymer and at least one of the blocks of which is a polyelectrolyte, enable a good dispersion of nanofillers in water, this dispersion having good film-forming qualities. The films obtained exhibit good application properties, not requiring post-treatment. They are both electrically conducting and ionionconducting.

SUMMARY OF THE INVENTION

The invention relates to a composition comprising at least one block copolymer which is soluble or which exhibits a stable dispersion in water and which has at least one block consisting of a conjugated polymer and at least one block consisting of a polyelectrolyte polymer.

DETAILED DESCRIPTION

Figure 1:
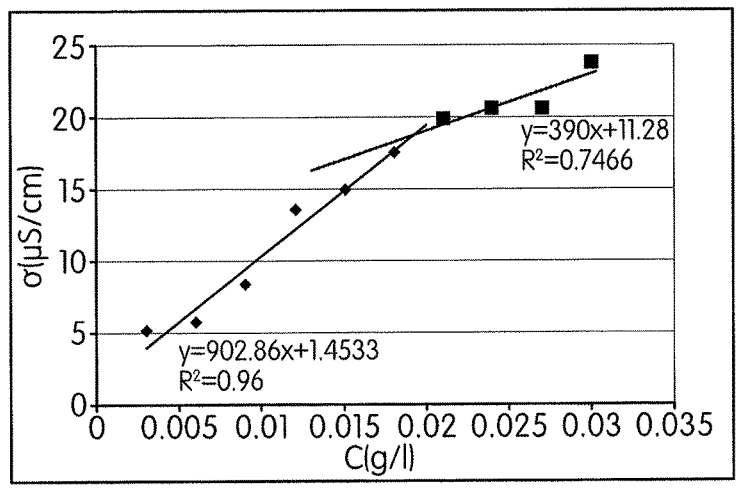
FIG. 1 shows a graph of experimental results from Example 2.

The term "stable dispersion" is intended to mean a dispersion which does not exhibit sedimentation and which remains homogeneous for at least one week.

The term "block copolymer" is intended to mean diblock, triblock or multiblock copolymers or a blend thereof, including the homopolymer of each of the blocks. Preferably, it is a diblock or triblock copolymer, and more preferably it is a diblock copolymer.

As regards the block(s) consisting of conjugated polymers, this may involve any type of polymer exhibiting conjugations of n type. Mention may be made of polymers derived from fluorene, from phenylene, from quinoline, from carbazole, from aniline, from thiophene, or from derivatives thereof. Preferably, this involves thiophene derivatives, more particularly 3-alkylthiophenes, and even more particularly 3-hexylthiophene.

The blocks consisting of conjugated polymers have a weight-average molecular weight of between 1000 and 50 000 g/mol, and preferably between 2000 and 10 000 g/mol, with a dispersity index (PI or D) greater than 1.

As regards the block(s) consisting of electrolyte polymers, this may involve any polyelectrolyte, among which mention may be made of polystyrene sulfonates, poly(styrene-co-styrene sulfonate), polyacrylic acids, polymers and copolymers bearing groups of bissulfonimide type, polymers and copolymers bearing groups of sulfonate type, polymers and copolymers bearing groups of phosphonate type, polyethyleneimine, poly(4-vinylpyridine)s and poly(2-vinylpyridine)s, poly(aminoalkyl(meth)acrylate)s, preferably electrolyte polymers of polyanion type, and preferentially polysulfonates.

Preferably, it is poly(styrene-co-styrene sulfonate).

The block copolymers of the invention can be prepared by any suitable technique. This involves in particular using techniques which make it possible to control the number of blocks, their ratio, their length, and also their dispersity.

Regarding the blocks consisting of conjugated polymers, they may be blocks obtained from monomers of fluorene, phenylene, quinoline, carbazole, aniline, thiophenes or derivatives thereof. Mention may be made, for example, of 3-hexylthiophene. Regarding more particularly poly(3-hexylthiophene), it is advantageously synthesized by Grignard metathesis polymerization reactions as described by Loewe, R. S. et al. Macromolecules (13) 4324, (2001). Moreover, these blocks can be monofunctionally or difunctionally modified, as described by Jeffries-El et al. Advanced Materials (12) 1017 (2004) and thus provide a function enabling the start of the polymerization of the polyelectrolyte block or of the precursor thereof.

In the specific case of poly(3-hexylthiophene), a functionalization of hydroxyl type makes it possible to initiate the polymerization of a monomer via the RAFT (reversible addition fragmentation chain transfer) technology. It is, for example, possible to polymerize therein a monomer which has a double bond, in a controlled manner, whether it is ionic or nonionic, and thus to obtain the desired conductive polymer-ionic polymer block copolymer. Any other coupling or polymerization technique which makes it possible to obtain this type of structure can also be used.

Any type of monomer which has a double bond can thus be used. Mention may in particular be made of the monomers butadiene, cyclohexadiene or isoprene, combined with other monomers, in particular vinylaromatics chosen from styrene, alpha-methylstyrene, para-methylstyrene, vinylnaphthalene, 2-vinylpyridine, 4-vinylpyridine or acrylates or methacrylates, such as methyl, ethyl, n-propyl, isopropyl, n-butyl, isobutyl, sec-butyl, tert-butyl, n-amyl, isoamyl, n-hexyl, cyclohexyl, 2-ethylhexyl, octyl, isooctyl, decyl, pentadecyl, dodecyl, isobornyl, phenyl, benzyl, glycidyl, norbornyl, lauryl, stearyl, phenoxyethyl, 2-hydroxyethyl, 2-methoxyethyl or 2,2,2-trifluoroethyl methacrylate or acrylate; methacrylonitrile, acrylonitrile and dialkylmethacrylamides, dialkylacrylamides, 2-acrylamido-2-methylpropanesulfonic acid, or a combination of these monomers which are functionalized or nonfunctionalized or which can be subsequently functionalized or partially functionalized. Preferably, the monomer is styrene, styrene sulfonate or a styrene-styrene sulfonate combination. Regarding the characteristics of the blocks consisting of polyelectrolyte polymers, thy have a weight-average molecular weight of between 1000 and 500 000 g/mol, and preferably between 2000 and 50 000 g/mol, with a dispersity index (PI or D) greater than 1.

The invention also relates to the use of the copolymers of the invention as a dispersant of nanofillers in aqueous media. The term "nanofillers" is intended to mean, without limitation, graphenes, fullerenes, carbon nanotubes, or a combination thereof. Preferably, they are carbon nanotubes. The carbon nanotubes used are of the single-walled or multi-walled type. They are preferably multi-walled carbon nanotubes.

The dispersions are obtained by mixing an aqueous solution of nanotubes in water with an aqueous solution of the block copolymer. In order to obtain a good dispersion, each solution is pretreated using an appropriate device, for example by sonification.

The invention also relates to the use of the films obtained using the dispersions of the block copolymers and of the nanofillers, as transparent electrodes in organic solar cells or other photoemitter or photoreceptor devices.

It has been possible to verify the good electrical conductivity of these systems and also their good optical and thermal-stability, UV-stability and moisture-stability properties.

Example 1 (Invention)

Synthesis of a Poly(3-hexylthiophene)-Poly(styrene-co-styrene sulfonate) block copolymer a) Synthesis of the Poly(3-hexylthiophene) block 50 ml of freshly distilled tetrahydrofuran (THF), 7 g of 2,5-dibromo-3-hexylethiophene and 10.7 ml of tert-butyl magnesium chloride are introduced into a 500 ml round-bottomed flask dried under vacuum and equipped with a stirrer and purged with argon. The reaction is completed in 3 hours at ambient temperature. 150 ml of freshly distilled THF and 0.3628 g of [1,3-bis-(diphenylphosphino)propane]dichloronickel(II) Ni(dppp)Cl$_2$ are then added, while maintaining the stirring for 40 min. 8.64 ml of allylmagnesium bromide are then added. After evaporation of the solvent under vacuum, the polymer is precipitated with an excess of methanol. The polymer is then purified using a soxhlet apparatus for three days with methanol and two days with chloroform. The number-average molecular weight is measured by SEC calibrated with polystyrene samples, which comes to 4522 g/mol. The dispersity is 1.1.

b) Functionalization of the Poly(3-hexylthiophene) block 120 ml of freshly distilled tetrahydrofuran (THF) are introduced into a 500 ml round-bottomed flask dried under vacuum and equipped with a stirrer and purged with argon. 1.4 g of the polymer prepared in a) and 1.75 ml of 9-borabicyclo[3.3.1]nonane (9-BBN) are introduced into the round-bottomed flask. The solution is then left to stir for 24 h at 45° C., and is then cooled to ambient temperature, followed by addition of 1.21 ml of hydrogen peroxide at 30% in water. The mixture is again heated at 45° C. for 24 h with stirring. The polymer is then precipitated from methanol.

c) Synthesis of the Macroinitiator RAFT Agent 10 ml (1 equivalent) of 3-mercaptopropionic acid are added to a solution of potassium hydroxide (13 g, 2 equivalents). 15 ml of carbon disulfide are then added and then the reaction is left to stir for 5 h at ambient temperature. 27.4 ml of benzyl bromide are then added to this solution and the resulting mixture is left to stir at 80° C. for 12 h. The reaction mixture is then cooled to ambient temperature and 150 ml of chloroform are added thereto, and then the reaction mixture is acidified with hydrochloric acid until the reaction mixture turns a yellow color. The aqueous phase of the mixture is extracted with chloroform. The organic phase is drawn off and is dried over magnesium sulfate. The final product is purified by flash chromatography with a 3:1 heptane/ethyl acetate mixture so as to finally obtain a yellow powder.

d) Synthesis of the RAFT Macroinitiator 20 ml of freshly distilled dichloromethane are introduced into a 100 ml round-bottomed flask dried under vacuum and equipped with a stirrer and purged with argon. 1 g of the polymer prepared in step b) is added. The solubilization is carried out by heating the mixture at 45° C. 0.125 g of the RAFT agent prepared in step c) is then added, followed by 0.03 g of 4-(dimethylamino)pyridinium 4-toluenesulfonate and 0.09 ml of N,N'-diisopropylcarbodiimide. The mixture obtained is left for 3 days at 30° C. with stirring. The polymer is then precipitated from methanol.

e) Polymerization of Styrene with the RAFT Macroinitiator 1 g of the RAFT macroinitiator obtained in step d) and 5 ml of styrene are introduced into a 100 ml round-bottomed flask, with stirring. The mixture is brought to 45° C. in order to facilitate good homogenization of the medium. After inerting with argon, the temperature is brought to 120° C. and the mixture is kept at this temperature with stirring for 4 h. The mixture obtained is cooled by immersing the round-bottomed flask in liquid nitrogen. The block copolymer obtained is characterized by SEC and has an Mn of 49 755 g/mol and a dispersity of 1.2 (Mn(PS) of 14 000 g/mol is determined by proton NMR).

f) Sulfonation of the Block Copolymer Obtained in e)

3 ml of dichloroethane and 2 ml of acetic anhydride are introduced into a 50 ml round-bottomed flask. This solution (1) kept under argon is cooled to 0° C. in an ice bath and 0.88 ml of 96% sulfuric acid is added thereto.

In parallel, 20 ml of dichloroethane are introduced, with argon inerting, into a 100 ml round-bottomed flask. 1.5 g of the copolymer prepared in e) are added thereto. This solution is heated at 45° C. in order to facilitate dissolution of the copolymer. The solution (1) is then gradually introduced therein, still under argon. This reaction mixture is left under reflux for 2 days, then 3 days at ambient temperature according to the desired degree of sulfonation. An insoluble blue-black solid is then formed. 2 ml of 2-propanol are added and the whole mixture is filtered in order to isolate the polymer. A degree of sulfonation of 60% of the styrene entities is measured by NMR.

Example 2 (Invention)

Physicochemical Characterization of the Copolymer

The aqueous solutions of copolymers are obtained with stirring at 100° C. for 24 h for concentrations above 0.2 g/l. For the concentrations below 0.2 g/l, dilution is carried out.

The micellar behavior of the block copolymer could be verified by measuring the conductivity at various concentrations. The change in slope corresponding to the critical micelle concentration could be determined at a concentration of 0.02 g/l ($1.1 \times 10^{-6}$ mol/l), see FIG. 1.

Figure 2:
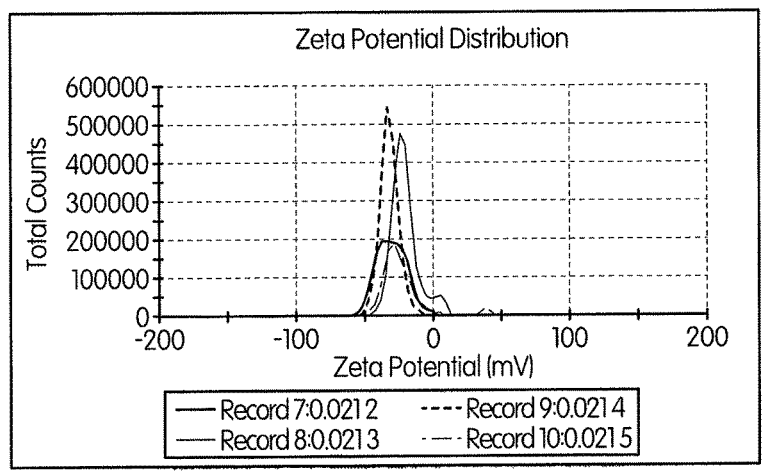
FIGS. 2 and 3 are graphs of zeta potential energy, from Example 2.
Figure 3:
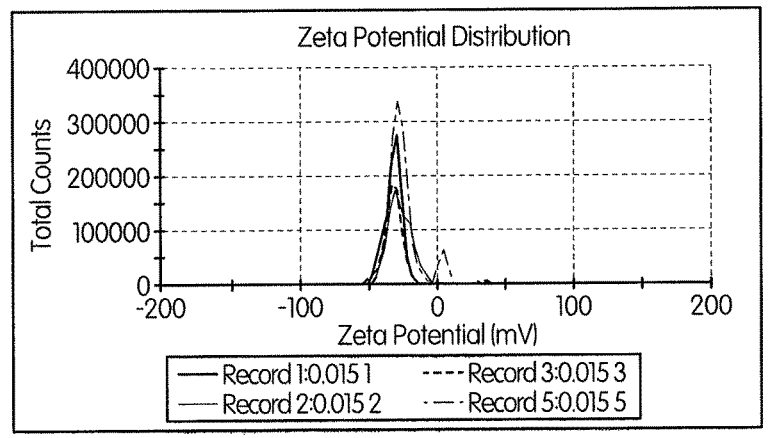

The micellar nature of the solution was, moreover, evaluated by measuring the Zeta potential at concentrations below and above the critical micelle concentration. In both cases, negatively charged aggregates are measured, thereby making it possible to conclude that the copolymer is self-assembled with the P3HT at the center and the PS-co-PSS as a crown (FIGS. 2 and 3).

Figures 4, 5:
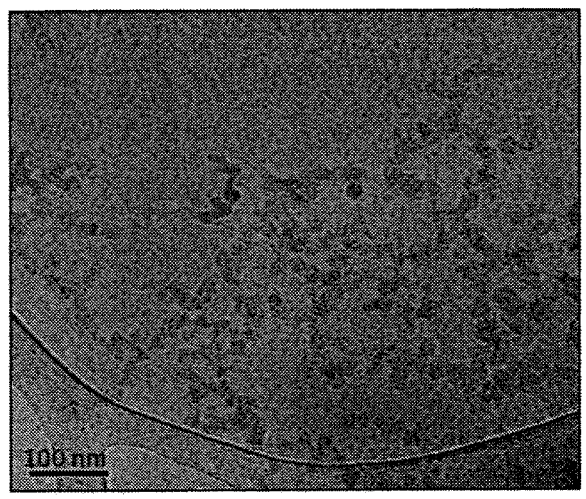
FIG. 4 is a transmission microscopy image, from Example 2.
FIG. 5 shows optical microscopy characteristics of samples prepared in Example 3.

The formation of micellar aggregates is, moreover, attested to by the transmission microscopy image, taken on a sample of cryogenized copolymer solution at 0.3 g/l (FIG. 4).

Example 3 (Invention)

Dispersion of Multi-Walled Carbon Nanotubes

The dispersion of carbon nanotubes in water in the presence of the block copolymer of the invention is carried out using a sonicator, with a power of 950 watts, for 10 minutes with 02/02 pulses and a final power of 285 in a water bath at ambient temperature.

2 ml of an aqueous 0.5% by weight solution of the copolymer of the invention are prepared beforehand by sonification for 5 min under the conditions described above. Gradual amounts of multi-walled carbon nanotubes (from Arkema), from 0.005 g up to 0.05 g, are then added. Stable dispersions are observed for concentrations up to 0.05% of multi-walled carbon nanotubes and 0.5% of the copolymer of the invention in 5 ml of water. The dispersions are characterized by optical microscopy (FIG. 5).

Example 4 (Invention)

Film Formation and Characterization

The films are prepared using the dispersions of example 3 on glass surfaces by means of the "doctor blade" technique. The films are then characterized by the transmittance in the 400-800 nm wavelength range (with a Shimadzu UV-VIS-NIR spectrophotometer instrument (UV-3600)), and by their resistivity (with a Jandel instrument, model RM3-AR). The thickness (in nanometers) of the film formed is also characterized (with an Alpha-Step IQ Profilometer instrument).

Figures 6, 7:
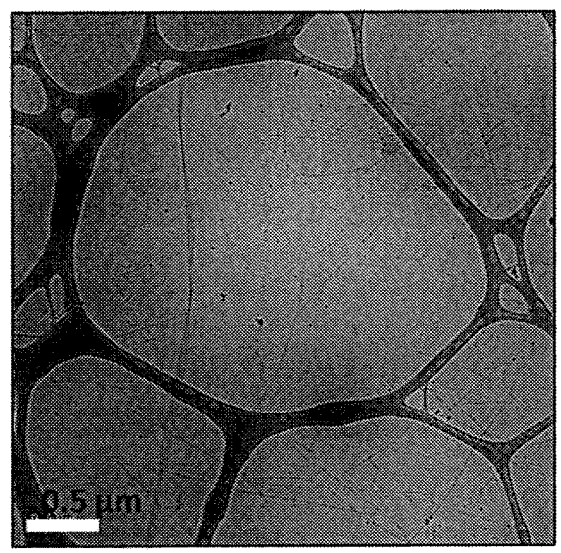
FIG. 6 is a table showing results obtained for the films of Example 4.
FIG. 7 is a transmission microscopy photograph of a sample prepared in Example 5.

The results are given in FIG. 6.

Example 5 (Invention)

Functionalized single-walled carbon nanotubes (Carbon solution Inc.) are purified using nitric acid and dispersed with the same technique as in example 3.

A transmission microscopy photo is taken on a cryomilled sample. A good dispersion of the carbon nanotubes is observed on FIG. 7. Moreover, the treatment used to disperse the carbon nanotubes did not affect their length. The small black particles observed are catalytic residues of the carbon nanotube synthesis.

Example 6 (Invention)

Figure 8:
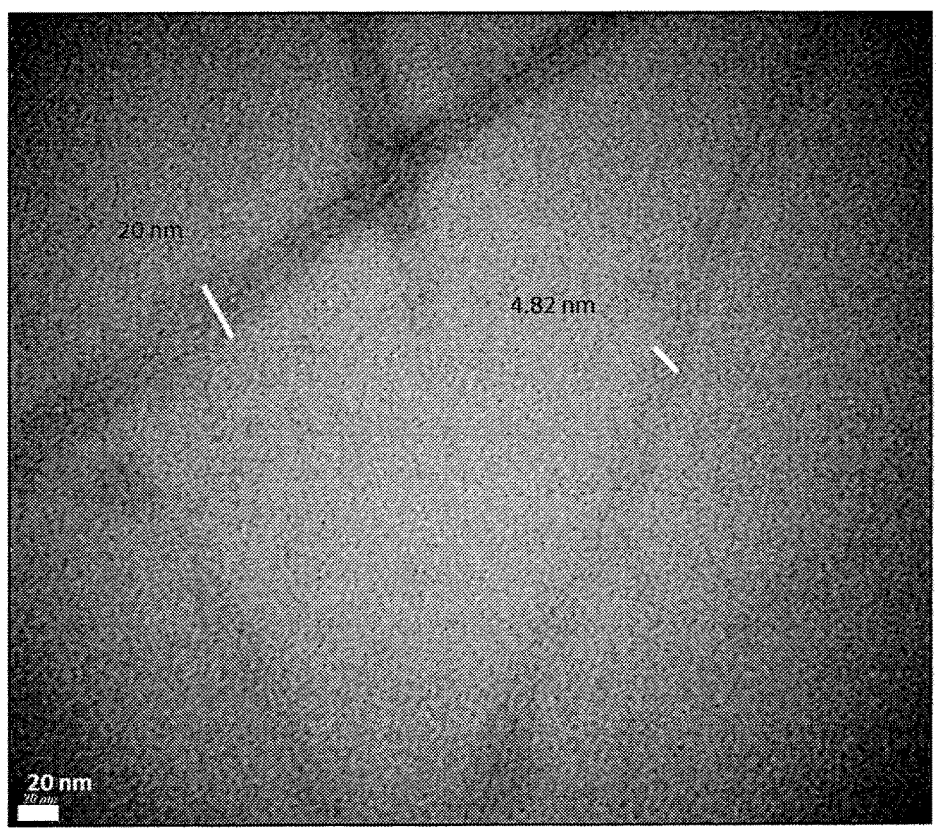
FIG. 8 is a transmission microscopy photograph of a sample prepared in Example 6.

Nonfunctionalized single-walled carbon nanotubes (Hanwha Nanotech, Korea) containing 10% by weight of catalyst and 20% by weight of graphite are dispersed according to the method described in example 3 and observed by high-resolution transmission microscopy after cryomilling. A good dispersion of these nanotubes and a thin layer at the surface of the carbon nanotubes, corresponding to the copolymer of the invention, are observed in FIG. 8.

Example 7 (Comparative)

Synthesis of a Poly(3-hexylthiophene)-Poly(acrylic acid) block copolymer

Firstly, a Poly(3-hexylthiophene)-Poly(tert-butyl acrylate) block copolymer is synthesized by nitroxide-controlled radical polymerization (NMP) using Blocbuilder® available from Arkema. The Blocbuilder®-terminated poly(3-hexylthiophene) macroinitiator was synthesized as described in the publication by Mougnier et al., Journal of Pol. Science Part A: Polymer chemistry. 2012, 50, 2463. The polymerization of the tert-butyl acrylate is carried out in the absence of oxygen, in toluene at 120° C. The Poly(3-hexylthiophene)-Poly(tert-butyl acrylate) copolymer is then precipitated with methanol, and is then converted into Poly(3-hexylthiophene)-Poly(acrylic acid) by hydrolysis in a 1:4 dioxane/trifluoroacetic acid (TFA) mixture.

Typically, in a suitable round-bottomed flask, the Blocbuilder®-terminated poly(3-hexylthiophene) macroinitiator (1 g, 0.2 mmol) is dissolved in 50 ml of toluene and stirred for 1 hour at 40° C. Next, 36 mmol of tert-butyl acrylate are added and the mixture is stirred for 5 minutes. The round-bottomed flask is then immersed in an oil bath at 115° C. with stirring for 5 hours. The round-bottomed flask is then immersed in a bath of liquid nitrogen in order to stop the polymerization. The block copolymer is isolated by precipitation from cold methanol, then filtered and dried under vacuum for 24 hours and characterized by $^1$H NMR and SEC in THF with polystyrene standards.

The block copolymer is then hydrolyzed in the following way: 0.05 mmol is stirred in chloroform for 30 minutes at ambient temperature under nitrogen in a 3-necked round-bottomed flask. After complete dissolution, 0.5 ml of TFA is added. 3 ml of 1,4-dioxane are added to this reaction mixture. The reaction is refluxed for 18 hours. A second portion of 1,4-dioxane (5 ml) is added and refluxed for 18 hours. The resulting copolymer is cooled to ambient temperature, precipitated with methanol, dried and filtered. It is characterized by $^1$H NMR, FTIR and SEC in THF with polystyrene standards. It is soluble in THF and chloroform.

Example 8

Comparison of the Carbon Nanotube Dispersions and Films in the Presence of Copolymers of the Invention and of Poly(3-hexylthiophene)-Poly(acrylic acid) copolymer The dispersions and films are prepared according to examples 3 and 4 under the same conditions according to whether the copolymers of the invention or the Poly(3-hexylthiophene)-Poly(acrylic acid) are used.

Measurements of transmittance at 550 nm as a function of the resistance of the film (measured in Ω/sq) are carried out. A reference consisting of a dispersion of carbon nanotubes in sodium dodecyl sulfate (SDS) is also measured.

Figure 9:
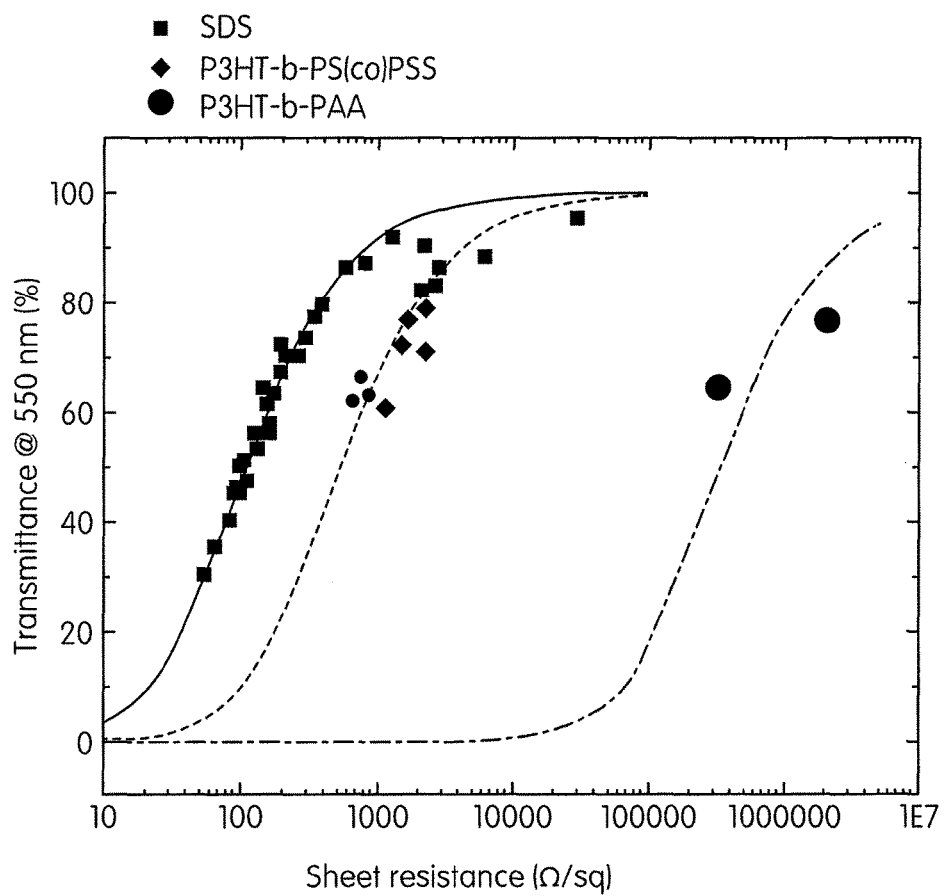
FIG. 9 is a graph of transmittance as a function of film resistance for dispersions prepared in Example 7.

As can be seen on FIG. 9, the copolymers of the invention allow a much better transmittance of the film for an equivalent film resistance when the copolymers of the invention are used compared with the Poly(3-hexylthiophene)-Poly (acrylic acid) copolymer.

The invention claimed is:

1. An aqueous dispersion comprising water, a composition comprising at least one block copolymer which is soluble or which exhibits a stable dispersion in water and which has at least one block consisting of a conjugated polymer and at least one block consisting of a polyelectrolyte polymer selected from the group consisting of polystyrene sulfonates and poly(styrene-co-styrene sulfonates), and a nanofiller.

2. The aqueous dispersion as claimed in claim 1, wherein the block copolymer(s) is (are) selected from the group consisting of diblock, triblock or multiblock block copolymers and mixtures thereof.

3. The aqueous dispersion as claimed in claim 1, wherein the aqueous dispersion comprises at least one diblock copolymer.

4. The aqueous dispersion as claimed in claim 1, wherein the conjugated polymer is a polymer of a thiophene derivative.

5. The aqueous dispersion as claimed in claim 4, wherein the thiophene derivative is a 3-alkylthiophene.

6. The aqueous dispersion as claimed in claim 5, wherein the thiophene derivative is 3-hexylthiophene.

7. The aqueous dispersion as claimed in claim 1, wherein the block consisting of a polyelectrolyte polymer has a weight-average molecular weight of between 1000 and 500 000 g/mol.

8. The aqueous dispersion as claimed in claim 1, wherein the at least one block consisting of a conjugated polymer has a weight-average molecular weight of between 1000 and 50 000 g/mol.

9. The aqueous dispersion as claimed in claim 1, wherein the nanofiller is chosen from graphenes, fullerenes, carbon nanotubes, or a combination thereof.

10. The aqueous dispersion as claimed in claim 9, wherein the nanofiller consists of carbon nanotubes.

11. The aqueous dispersion as claimed in claim 9, wherein the nanofiller consists of multi-walled carbon nanotubes.

12. The aqueous dispersion of claim 1, wherein the at least one block copolymer has at least one poly(styrene-co-styrene sulfonate) block and at least one poly(3-hexylthiophene) block.

13. A method of making a transparent electrode for use in an organic solar cell or other photoemitter or photoreceptor device, comprising using an aqueous dispersion as claimed in claim 1.

14. The method as claimed in claim 13, wherein the nanofiller is chosen from graphenes, fullerenes, carbon nanotubes, or a combination thereof.

15. The method as claimed in claim 14, wherein the nanofiller consists of carbon nanotubes.

16. The method as claimed in claim 14, wherein the nanofiller consists of multi-walled carbon nanotubes.

17. A method of making an aqueous dispersion in accordance with claim 1, comprising mixing an aqueous solution of a nanofiller with an aqueous solution of a composition comprising at least one block copolymer which is soluble or which exhibits a stable dispersion in water and which has at least one block consisting of a conjugated polymer and at least one block consisting of a polyelectrolyte polymer selected from the group consisting of polystyrene sulfonates and poly(styrene-co-styrene sulfonates).

18. The method of claim 17, additionally comprising a pretreatment step of sonification of the aqueous solution of the nanofiller and the aqueous solution of the composition.

* * * * *